(12) United States Patent
Kan

(10) Patent No.: US 6,265,952 B1
(45) Date of Patent: Jul. 24, 2001

(54) ADAPTER FOR SURFACE MOUNTED DEVICES

(75) Inventor: David T. Kan, Rancho Palos Verdes, CA (US)

(73) Assignee: Pulse Research Labs, Torrance, CA (US)

( * ) Notice: Subject to any disclaimer, the term of this patent is extended or adjusted under 35 U.S.C. 154(b) by 0 days.

(21) Appl. No.: 09/369,229

(22) Filed: Aug. 5, 1999

Related U.S. Application Data

(60) Provisional application No. 60/095,412, filed on Aug. 5, 1998.

(51) Int. Cl.[7] .............................. H03H 7/38; H05K 1/00
(52) U.S. Cl. ........................... 333/33; 361/748; 361/761; 361/767
(58) Field of Search ..................... 333/247, 33; 257/664, 257/678; 361/748, 738, 767, 761, 760, 807

(56) References Cited

U.S. PATENT DOCUMENTS

| | | | | |
|---|---|---|---|---|
| 4,604,678 | * | 8/1986 | Hagner | 361/401 |
| 5,151,039 | | 9/1992 | Murphy | 439/70 |
| 5,173,767 | * | 12/1992 | Lange et al. | 333/247 X |
| 5,424,693 | * | 6/1995 | Lin | 333/247 X |
| 5,572,409 | | 11/1996 | Nathan et al. | 361/806 |
| 5,612,657 | * | 3/1997 | Kledzik | 333/247 |
| 6,090,647 | * | 7/2000 | Grass | 438/151 |

* cited by examiner

*Primary Examiner*—Benny Lee
*Assistant Examiner*—Stephen E. Jones
(74) *Attorney, Agent, or Firm*—Fish & Richardson PC

(57) ABSTRACT

A surface mount adapter for a surface mount device is provided that includes a printed circuit board with a top side and a bottom side. The top side includes a footprint for receiving an electrical component and a plurality of input/output lines connected between the footprint and a plurality of first through hole pins. The adapter also includes a ground plane and a power plane and is suitable for use with RF and ECL devices.

21 Claims, 6 Drawing Sheets

ADAPTER FOR SURFACE MOUNTED DEVICES

CROSS REFERENCE TO RELATED APPLICATIONS

This application claims the benefit of U.S. Provisional Patent Application No. 60/095,412, filed Aug. 5, 1998.

BACKGROUND OF THE INVENTION

The present invention relates generally to attaching electrical components to printed circuit boards, and more particularly, to adapters for surface mount devices.

An integrated circuit combines numerous active and passive electrical circuitry elements on a single device called a die or chip. These integrated circuits are interconnected by attaching them to printed circuit boards. Such circuits are inherently small and fragile devices. Thus, they are usually embedded in a substrate called a chip carrier or package before they are attached to the printed circuit board. Protruding from the package are a number of electrical conducting leads. The conducting leads may protrude from the package by extending through the bottom of the package (e.g., pin or pad grid arrays), may be arrayed along two edges of the package (e.g., dual in-line pins), or may fan out from the edges of the package (e.g., gull wing and jay pins).

The wiring on printed circuit boards may include thin metallic strips embedded in an insulating material. These strips interconnect leads from different circuit packages mounted on the same board. For all of the required connections, the boards may have several layers of interconnected wiring. The wiring is used to determine the placement of the integrated circuit packages on the board. Also, the wiring is employed to route electrical signals among the integrated circuits. The leads may connect to the wiring in a variety of ways. One technique includes drilling holes in the board and through the wiring at appropriate locations, inserting the leads through the holes, and making mechanical and electrical attachments among the leads, the wiring, and the holes. Another technique is called surface mount technology (SMT). This method includes arranging contact pads on the surface of the printed circuit board. The pads are used to deliver electrical signals to the leads and to the appropriate embedded wires. Leads may be placed on top of the pads and mechanically and electrically attached.

SMT is widely used for high speed digital communications. Typical packages include plastic leaded chip carriers (PLCC), dual in-line packages (DIP), single in-line packages (SIP), small outline packages (SO), and small outline T-leaded packages (SOT). To test or prototype these type devices, custom device-specific evaluation boards supplied by the manufacturer are required. This is because each device has a different specific footprint. In many cases, a large number of the device-specific evaluation boards are required. As a result, prototyping can be limited. For example, if a certain device-specific evaluation board was not available, an entire prototype procedure may be impeded.

Also, these high speed devices require controlled impedance inputs and outputs that are not easily implemented in a general printed circuit board configuration. Certain commercially available surface-mount to DIP and SIP adapters have been employed. However, these adapters are not suitable for high frequency applications. These adapters have long traces between the device footprint and the pins of the DIP or SIP. This can create excessive noise in the resulting signal, and also, poor performance from the integrated circuit. Additionally, critical components, such as a power supply pin, must be located on the printed circuit board. As a result, long wire traces must be used to interconnect the device to other components in the system. This can also contribute to faulty signal and circuit operation.

SUMMARY OF THE INVENTION

In general, the present invention is directed to a surface mount adapter for a surface mount device that includes a plurality of matched impedance input/output lines for connecting the surface mount device to a plurality of through hole pins. The adapter may be connected to a motherboard or other prototyping board for testing or prototyping the surface mount device.

Accordingly, in one aspect, the adapter includes a printed circuit board having a top layer and bottom layer, and a footprint formed on the top layer of the printed circuit board for receiving the surface mount device. A plurality of impedance matching input/output lines are connected between a plurality of electrical pins of the surface mount device and a plurality of through hole pins attached to the printed circuit board.

Implementations of the invention include one or more of the following. The surface mount device may be an emitter coupled logic device or a high frequency surface mount device. The adapter may include at least one ground plane and at least one power plane. The surface mount device may be connected to the ground plane via an input termination resistor, and may be connected to the power plane by at least one decoupling capacitor. The ground plane may be formed between the top layer and the bottom layer. The input/output pins may be 50 Ω transmission lines. The number of electrical pins may be between 8 and 30. The adapter may further include a clamp and an input termination resistor electrically connected to the through hole pins through the clamp. A decoupling capacitor may also be electrically connected to the through hole pins through the clamp.

In accordance with another aspect, the adapter may include a printed circuit board having a top layer and a bottom layer, and a footprint formed on the top layer of the printed circuit board for receiving the surface mount device. A plurality of vias may be formed in the printed circuit board for receiving a plurality of electrical pins of the surface mount device. A plurality of impedance matching input/output lines may be connected between a plurality of pads formed on the bottom layer and the electrical pins through the vias. A plurality of series components or shunt components may be connected between the pads and a plurality of through hole pins attached to the printed circuit board.

Implementations of the invention include one or more of the following. The surface mount device may be a radio frequency device. The adapter may include a plurality of connecting strips for forming a filter network. The series components may be coupling capacitors or jumpers. The adapter may be connected to a motherboard or a prototyping board.

The details of one or more embodiments of the invention are set forth in the accompanying drawings and the description below. Other features, objects, and advantages of the invention will be apparent from the description and drawings, and from the claims.

DESCRIPTION OF THE PREFERRED EMBODIMENTS

Figure 1:
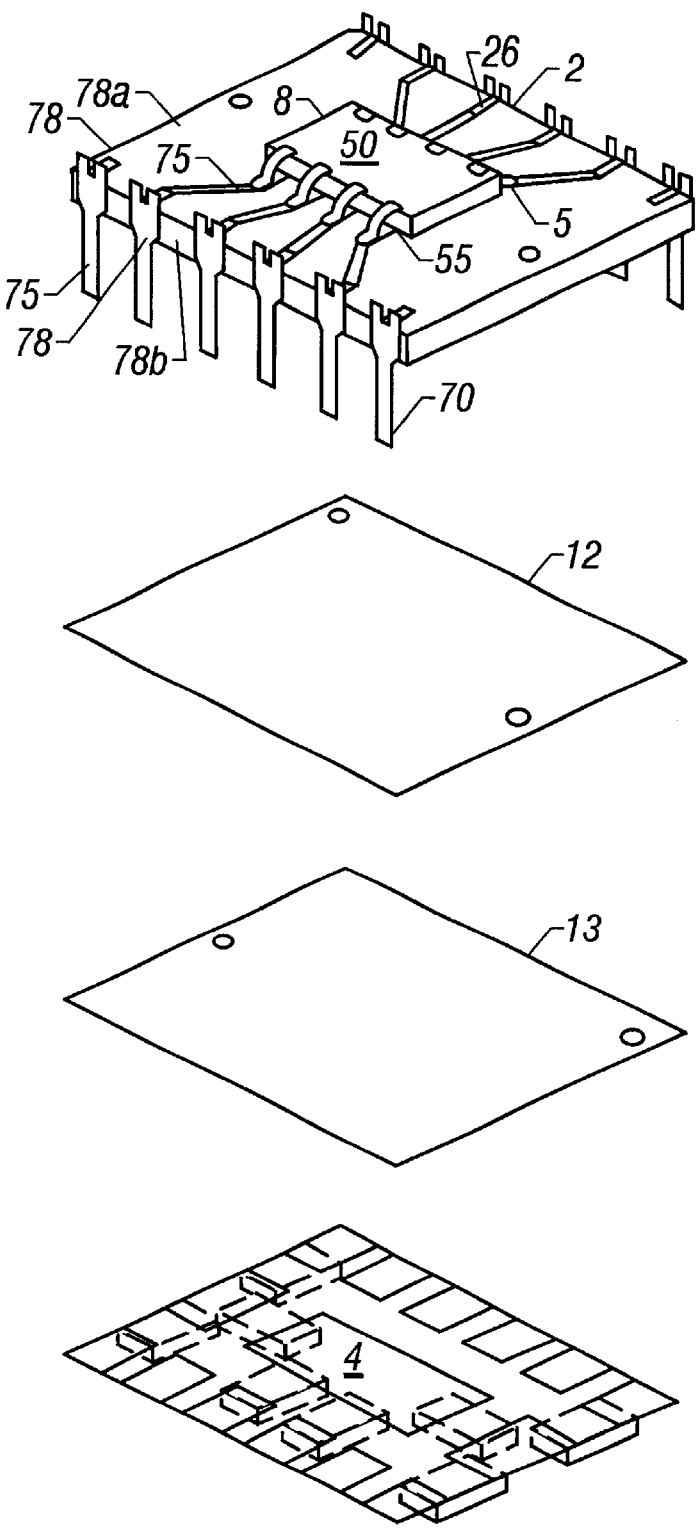
FIG. 1 is an exploded view of an adapter in a first embodiment.

FIG. 1 is a exploded view of an adapter 1 in a first embodiment. The adapter 1 includes a multi-layer printed circuit board (PCB) 3. The PCB 3 includes a top layer 2, a power layer 13, a ground layer 12, and a bottom layer 4. The power layer 13 is optional. Layers 2, 4, 12, and 13 may be secured in a conventional manner. The power layer 13 may be formed onto the layer 2 or on the bottom layer 4. Further, individual ground layers can be formed on the top layer 2 or the bottom layer 4. The PCB 3 may be molded from non-conductive high impedance material. The non-conductive high impedance material may be partially elastic and non-brittle. For example, the PCB 3 may be formed from plastics, polymer, or resins.

The top layer 2 includes a footprint 5 for receiving an electrical component 50, such as a surface mount device. The electrical component 50 may be a gigahertz surface mount device. The electrical component 50 may be an emitter coupled logic (ECL) device. The footprint 5 includes a plurality contact areas 8 for receiving a plurality of electrical leads or pins 55 extending from the bottom of electrical component 50. Preferably, the electrical leads 55 and the electrical component 50 are secured to the contact areas 8 and footprint 5, respectively, by soldering or other suitable means. The number of pins 55 and the number of contact areas 8 can be varied. For example, the number of pins 55 and contact areas 8 can be between 8 and 30 or more.

FIG. 1 illustrates that each of the electrical contacts 8 is electrically connected to a corresponding pad by through hole pin assembly 70 via an input/output line 26. Preferably, each input/output line 26 is used to control the impedance of each component pin 55 to match the impedance of the electrical component 50. The input/output line 26 may be a 50 Ω transmission line or other suitable transmission line. This means that high frequency signals can be used to operate the electric component without excessive noise.

The through hole pin assembly 70 includes a through hole pin 75 and a clamp 78. The clamp 78 includes a top portion 78a and bottom portion 78b. The adapter 1 may include any number of pins 75 to secure the adapter 1 to a motherboard or prototyping board. In a preferred embodiment, the adapter 1 may have pins 75 dedicated to power (e.g., $V_{CC}$, $V_{TT}$, $V_{EE}$) and ground connections. Accordingly, these pins may be connected directly to planes 12 and 13. This means that no long wire traces need to be employed to connect the component to the power and/or ground connections on the motherboard as in known systems. Thus, the preferred configuration is compact and does not significantly suffer from loss due to noise from the long traces.

The ground plane 12 and the power plane 13 may be connected to selected pins corresponding to power and ground pins on the electrical component 50. The ground and power planes 12 and 13 may be connected to the pins 55 or 75 using short electrical traces. This means that the pins 55 can be connected to the ground or power planes without using long traces to an attached motherboard as in prior systems. Thus, the preferred configuration is compact and does not significantly suffer from loss due to noise from long wire traces.

Figure 2:
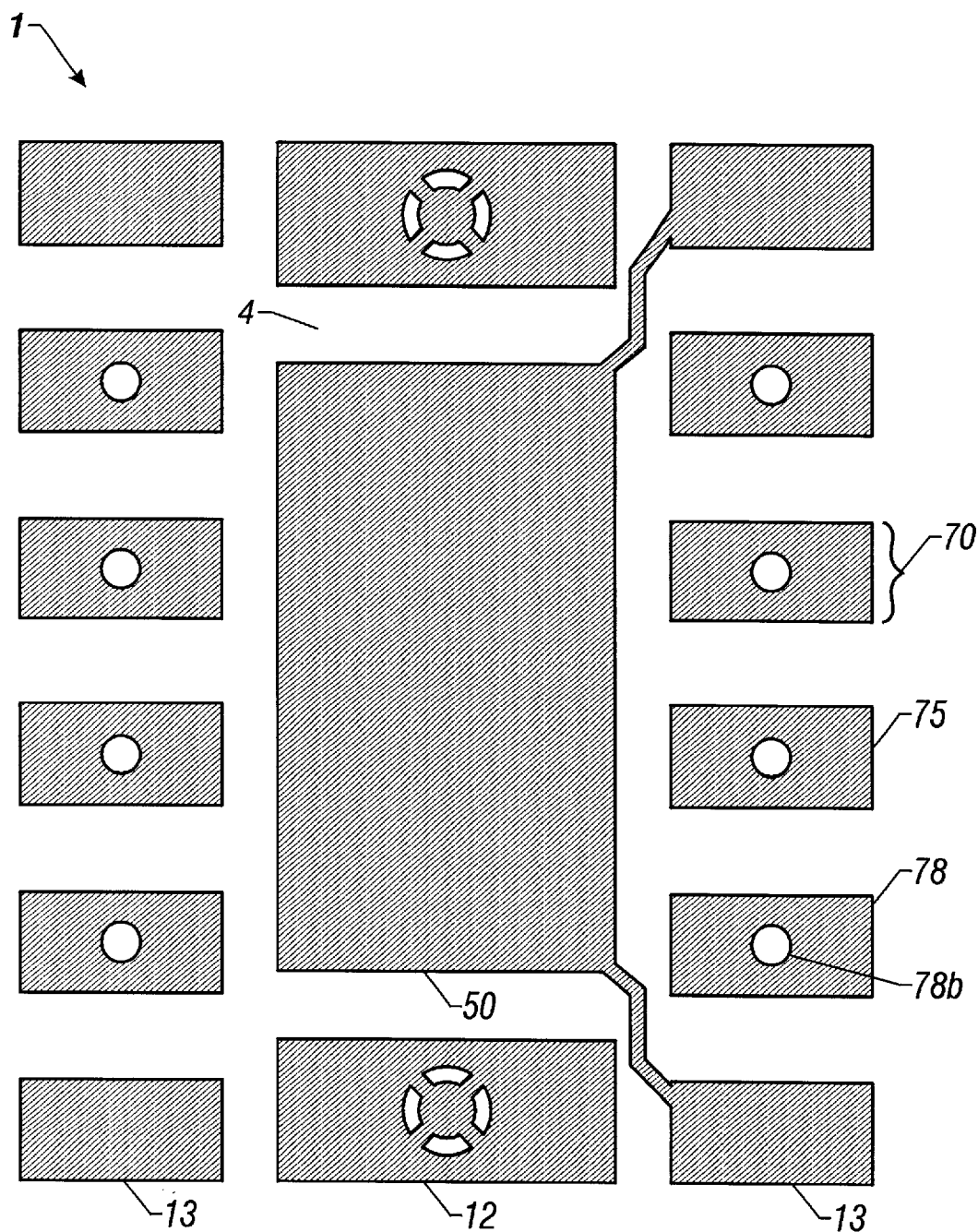
FIG. 2 is a bottom view of the adapter of FIG. 1.

FIG. 2 illustrates a bottom layer 4 of adapter 1. The bottom layer 4 includes the clamp portions 78b in electrical contact with and corresponding to the clamp portions 78a on the top layer 2 of adapter 1. Preferably, critical components of the electrical component 50, including coupling capacitors, termination resistors, and other series and/or shunt components, can be mounted to the clamp portions 78b. This means that the critical components can be mounted to corresponding pins 55 of the electrical component 50 via clamp assembly 70.

Figure 3:
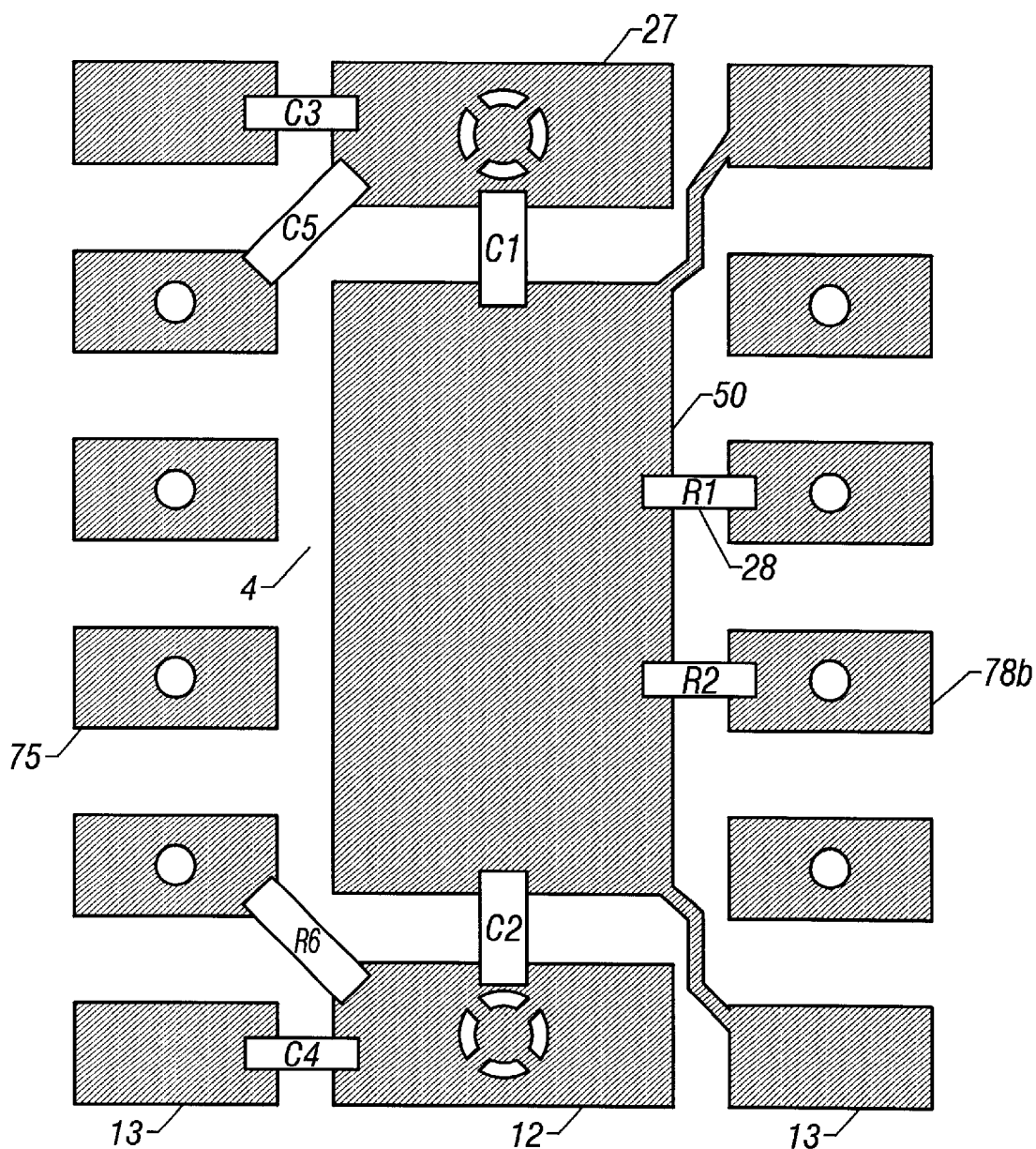
FIG. 3 illustrates an implementation of the adapter of FIG. 1.

FIG. 3 illustrates an implementation of the adapter 1 with attached electrical component 50. The electrical component 50 is attached to the adapter 1. At this stage, the bottom of the electrical component 50 rests substantially planar to the footprint 5. The pins 55 of the electrical component 50 are connected to the pins 75 of the adapter board 1 via input/output lines 26. FIG. 3 illustrates that a termination resistor 28 may be connected to the power plane 13 (e.g., a $V_{TT}$ plane for an ECL device) on the bottom layer 4. Further, a decoupling capacitor 27 (e.g., a $V_{TT}$ plane and $V_{EE}$ plane for an ECL device) may be connected to the ground plane 12 on the bottom layer 4. This means that the critical components can be attached in close proximity to the electrical component 50. This creates a more compact or more efficient adapter than in known systems. This is because no long wire traces are used to attach critical components to the pins 75.

Figure 4:
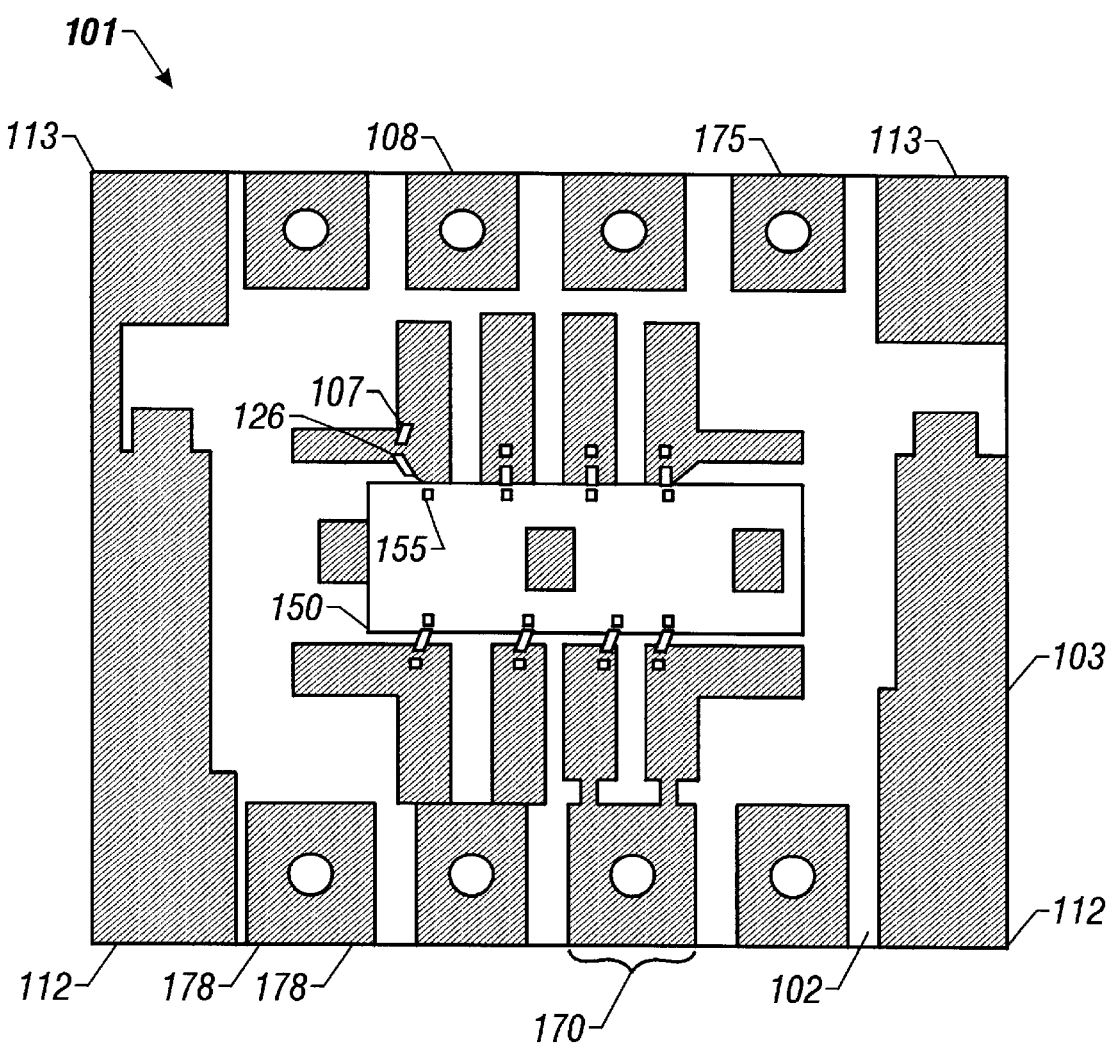
FIG. 4 is a top view of an adapter in a second embodiment.

FIG. 4 illustrates a second embodiment of an adapter 101 having a PCB 103 in accordance with the present invention. PCB 103 is constructed similar to PCB 3 described above. In this embodiment, the adapter 101 includes a top layer 102 having a footprint 105. The footprint 105 includes a plurality of contact areas 108 for receiving a plurality of electrical leads 155 extending from the an electrical component 150. Preferably, the electrical component 155 is a surface mount device, such as a Radio Frequency (RF) device. The electrical component may be a gigahertz surface mount device. The contact areas 108 include a plurality of vias 107 formed through the PCB 103. The number of pins 155 and the number of contact areas 108 can be varied. For example, the number of contact areas 108 and pins 155 may be between 8 and 30 or more.

The adapter 101 also includes ground planes 112 and power planes 113 that function similarly to the ground plane 12 and the power plane 13 of the adapter 1. In one configuration, the ground plane 112 may extend longitudinally across the adapter 101 (FIG. 5).

Figure 5:
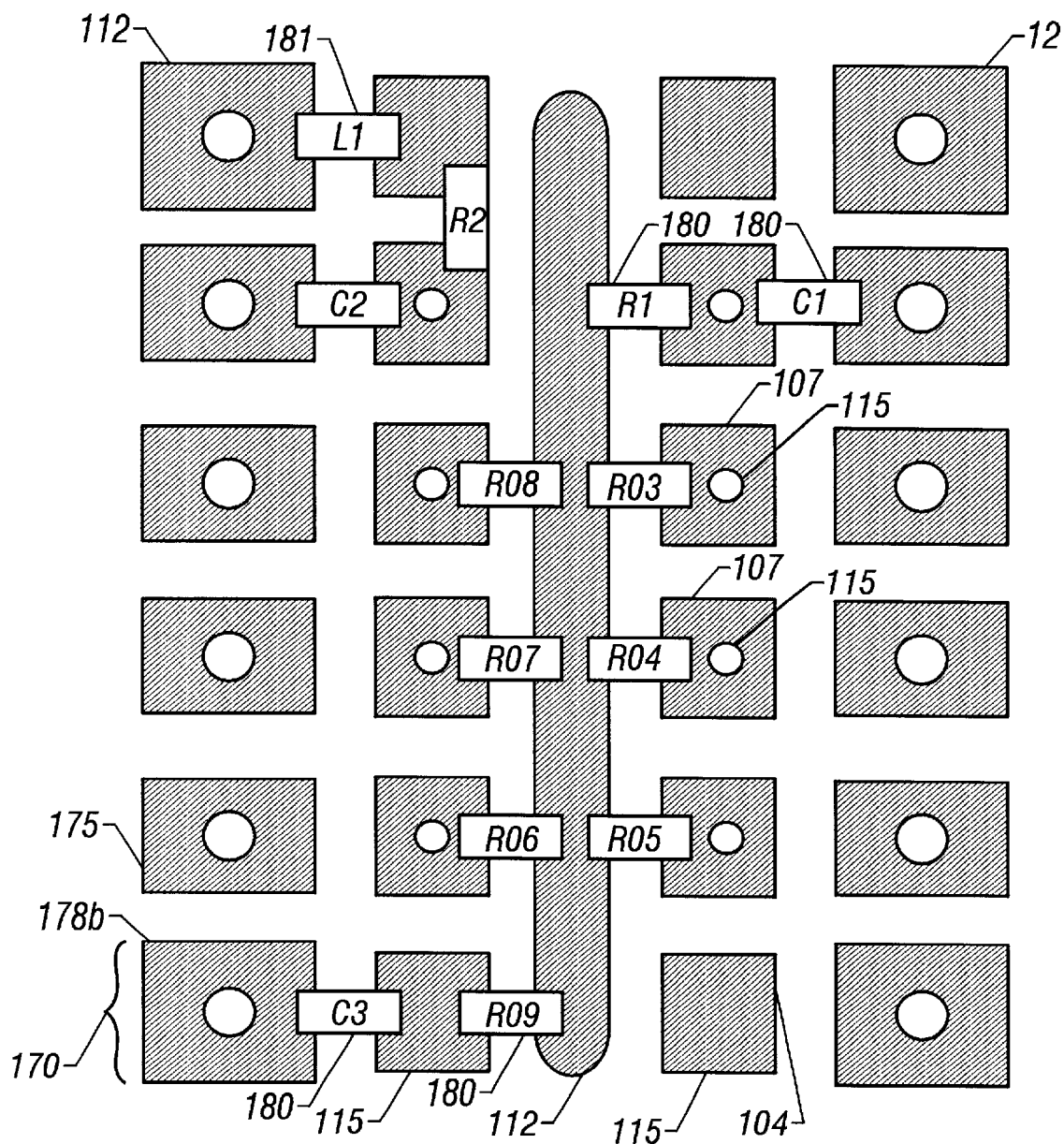
FIG. 5 is a bottom view of the adapter of FIG. 4.

FIG. 5 illustrates that each of the electrical pins 155 is electrically connected to a corresponding pad 115 on bottom layer 104. The pins 155 may be connected to the pads 115 via input/output lines 126 extending through vias 107. The input/output lines 126 operate similar to the input/output lines 26 described above in the first embodiment. The number of pads 115 may be varied. For example, the number of pads may be between 8 and 30 or more.

The pads 115 are also electrically connected to corresponding through hole pin assemblies 170. The pads 115 may be electrically connected to assemblies 170 via circuit traces or through series components 180 such as coupling capacitors or zero Ohm jumpers. Through hole pin assembly 170 includes a through hole pin 175 and a clamp 178 having clamp portions 178a and 178b. Through hole pin assemblies 170 are similar to and function substantially the same as assemblies 70. Additionally, shunt components 181, such as resistors and/or capacitors, may be used to connect pads 115 to ground plane 112.

Figure 6:
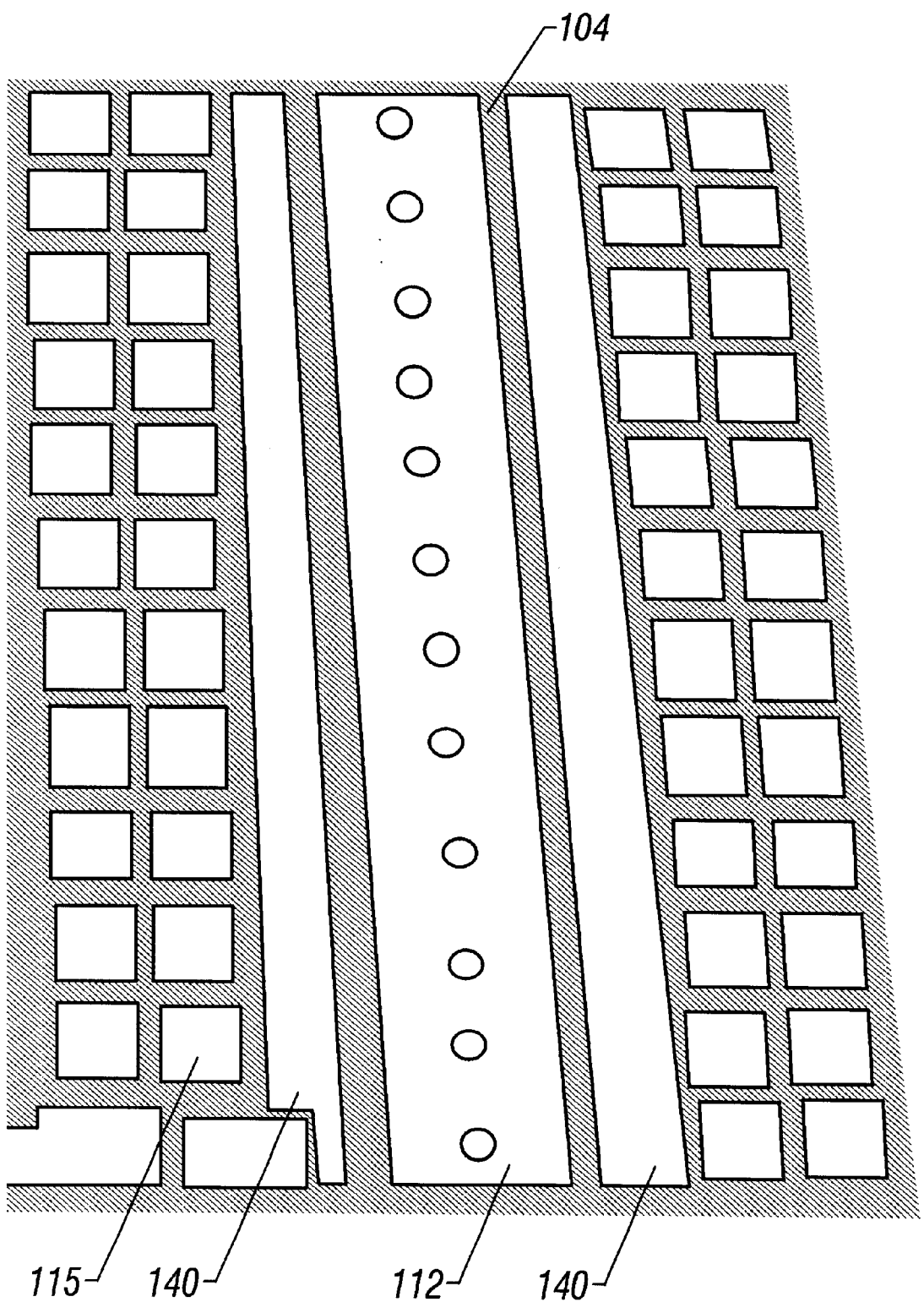
FIG. 6 is a bottom view of the adapter of FIG. 4 including a plurality of connecting strips.

The adapter 101 may also include a plurality of connecting strips 140 placed between the pads and the ground plane 112 on the bottom side 104, as shown in FIG. 6. In this configuration, a filter network may be used on the adapter board to reduce noise and cross talk. For an RF component, a filter network may also be used to limit or set the bandwidth of the electrical component. The filter network may include a low-pass, high-pass, or band-pass filter circuit. A connector strip 140 allows the filter network to be formed on the adapter. This decreases the amount of space used on the motherboard. Additionally, this configuration reduces the interconnect distance between the filter and the electrical component. This means that the system is compact and does not suffer from excess noise due to long wire traces. In operation, a pad can be grounded by connecting a size 2010 zero Ohm jumper between the ground plane 111 and the pad 115. Alternatively, the pad 115 may be connected to one of the connecting strips 140 and then to the ground plane 111 using a size 0850 or 1206 zero Ohm jumper.

The adapters 1 or 101 can be connected to a motherboard or a prototyping board. Preferably, the motherboard includes a three-pad-per-pin configuration. Interconnections between components on the motherboard may be made using 50 Ω coaxial cables, short jumpers, or plug-in 50 Ω PC transmission line modules. The motherboard may be connected to external devices, such as a power source, using SIP or DIP RF connector adapters.

Although the invention has been described with reference to the presently preferred embodiment, it should be understood that various modifications can be made without departing from the spirit of the invention. Accordingly, the invention is limited only by the following claims. For example, the top side or bottom side of the adapter boards 1, 101 may be reversed for various active or passive component embodiments.

What is claimed is:

1. An adapter for a surface mount device comprising:
   a printed circuit board having a top layer and a bottom layer;
   a footprint formed on the top layer of the printed circuit board, a surface mount device being mounted to the footprint; and
   a plurality of impedance matching input/output lines extending from a plurality of contact areas of the footprint to a plurality of through hole pins, the through hole pins being coupled to an outer perimeter of the printed circuit board.

2. The adapter of claim 1, wherein the surface mount device is an emitter coupled logic device or a high frequency surface mount device.

3. The adapter of claim 1, wherein the adapter is connected to a motherboard or a prototyping board.

4. The adapter of claim 1, wherein the surface mount device is a gigahertz surface mount device.

5. The adapter of claim 1, wherein the input/output lines are 50 Ω transmission lines.

6. The adapter of claim 1, wherein the number of electrical pins is between 8 and 30.

7. The adapter of claim 1, further comprising a clamp and an input termination resistor electrically connected to the through hole pins through the clamp.

8. The adapter of claim 1, further comprising a clamp and at least one decoupling capacitor electrically connected to the through hole pins through the clamp.

9. The adapter of claim 1, further comprising at least one ground plane and at least one power plane.

10. The adapter of claim 9, wherein the surface mount device is connected to the ground plane via an input termination resistor.

11. The adapter of claim 9, wherein the surface mount device is connected to the power plane by at least one decoupling capacitor.

12. The adapter of claim 9, wherein at least one ground plane is formed between the bottom and top layers.

13. An adapter for a surface mounted device, comprising:
    a printed circuit board having a top layer and a bottom layer;
    a footprint formed on the top layer of the printed circuit board, a surface mount device being mounted to the footprint;
    a plurality of vias formed in the printed circuit board for receiving a plurality of electrical pins of the surface mount device;
    a plurality of impedance matching input/output lines extending from the plurality of contact areas of the footprint to a plurality of through hole pins, the through hole pins being coupled to an outer perimeter of the printed circuit board; and
    a plurality of series components connected between the pads and a plurality of through hole pins attached to the printed circuit board.

14. The adapter of claim 13, wherein the surface mount device is a radio frequency device or a high frequency surface mount device.

15. The adapter of claim 13, further comprising at least one ground plane and at least one power plane.

16. The adapter of claim 13, further comprising a plurality of connecting strips for forming a filter network.

17. The adapter of claim 13, wherein the series components are coupling capacitors or jumpers.

18. The adapter of claim 13, wherein the adapter is connected to a motherboard or a prototyping board.

19. The adapter of claim 13, further comprising a ground plane formed between the bottom and top layers.

20. The adapter of claim 13, further comprising a clamp, the series components or the shunt components being electrically connected to the through hole pins through the clamp.

21. The adapter of claim 13, wherein the surface mount device is a gigahertz surface mount device.

* * * * *